US012740452B2

(12) United States Patent
Araki et al.

(10) Patent No.: US 12,740,452 B2
(45) Date of Patent: Sep. 15, 2026

(54) SEMICONDUCTOR DEVICE AND MANUFACTURING METHOD THEREFOR

(71) Applicant: NTT, Inc., Tokyo (JP)

(72) Inventors: Yusuke Araki, Musashino (JP); Hideaki Matsuzaki, Musashino (JP); Yuta Shiratori, Musashino (JP)

(73) Assignee: NTT, Inc., Tokyo (JP)

( * ) Notice: Subject to any disclaimer, the term of this patent is extended or adjusted under 35 U.S.C. 154(b) by 352 days.

(21) Appl. No.: 18/553,813

(22) PCT Filed: May 19, 2021

(86) PCT No.: PCT/JP2021/018926
§ 371 (c)(1),
(2) Date: Oct. 3, 2023

(87) PCT Pub. No.: WO2022/244130
PCT Pub. Date: Nov. 24, 2022

(65) Prior Publication Data

US 2024/0371740 A1 Nov. 7, 2024

(51) Int. Cl.

| | |
|---|---|
| ***H10W 70/65*** | (2026.01) |
| ***H10P 72/70*** | (2026.01) |
| ***H10W 70/60*** | (2026.01) |
| ***H10W 74/10*** | (2026.01) |
| ***H10W 90/00*** | (2026.01) |

(52) U.S. Cl.
CPC ............. *H10W 70/65* (2026.01); *H10P 72/74* (2026.01); *H10W 70/611* (2026.01); *H10W 74/114* (2026.01); *H10W 90/00* (2026.01); *H10W 90/401* (2026.01); *H10W 74/10* (2026.01); *H10W 90/756* (2026.01)

(58) Field of Classification Search
CPC ........... H01L 21/6835; H01L 23/49833; H01L 25/0657
See application file for complete search history.

(56) References Cited

FOREIGN PATENT DOCUMENTS

| | | | | | |
|---|---|---|---|---|---|
| JP | H06-216310 | A | | 8/1994 | |
| JP | 2000-174200 | A | | 6/2000 | |
| JP | 2009176825 | A | * | 8/2009 | |
| JP | 2011124366 | A | * | 6/2011 | ............. H01L 24/97 |
| JP | 2012-256803 | A | | 12/2012 | |

OTHER PUBLICATIONS

Soon Wee Ho et al., *Development of FO-WLP Package-on Package Using RDL-First Integration Flow*, 2018 20th Electronics Packaging Technology Conference, Dec. 4, 2018, pp. 612-617.

* cited by examiner

*Primary Examiner* — Nicholas J Tobergte
(74) *Attorney, Agent, or Firm* — Workman Nydegger

(57) ABSTRACT

A semiconductor device includes a first wiring layer, a first semiconductor chip, a second wiring layer, and a second semiconductor chip. In addition, in the semiconductor device, a molding resin layer that molds the first semiconductor chip on the first wiring layer and a molding resin layer that molds the second semiconductor chip on the second wiring layer are formed, and the molding resin layers are integrally formed through a through-hole.

7 Claims, 18 Drawing Sheets

SEMICONDUCTOR DEVICE AND MANUFACTURING METHOD THEREFOR

TECHNICAL FIELD

The present invention relates to a semiconductor device and a method for manufacturing the same.

BACKGROUND ART

In recent years, mobile devices such as smartphones have rapidly developed, and demands for higher density of electronic components have further increased. Based on such requirements, research on a package on package (PoP) structure has been actively conducted. The PoP structure is a structure in which a plurality of semiconductor chips is stacked in the vertical direction, and is a structure that achieves high-density mounting without changing a mounting area.

In a case where mobile applications are assumed, since a demand for a package thickness is severe, a technique for suppressing a thickness of a completed electronic component is indispensable. Under such a background, a PoP structure using a wafer level package (WLP) has attracted attention. WLP is an integration technology that achieves batch mounting by sealing a plurality of chips with a molding resin on a wafer scale. In WLP, the thickness of the completed electronic component is reduced because no substrate is required for a final package. In addition, WLP can reduce manufacturing cost per package by mass production due to characteristics of its manufacturing process. Such a PoP structure using WLP is a structure suitable for mobile applications.

A typical technique will be described with reference to FIG. 4 (Non Patent Literature 1). A semiconductor device in FIG. 4 includes a first wiring layer 301, and a first semiconductor chip 302 and a second semiconductor chip 303 mounted on the first wiring layer 301. The first semiconductor chip 302 and the second semiconductor chip 303 are electrically connected to each other through a wiring 301*a* formed in the first wiring layer 301. In addition, the wiring 301*a* is connected to a terminal 301*b* formed on a lower surface of the first wiring layer 301. In addition, on the first wiring layer 301, the first semiconductor chip 302 and the second semiconductor chip 303 are molded with a first molding resin 304.

Further, a second wiring layer 305 is formed on the first molding resin 304 in contact therewith, a third semiconductor chip 306 and a fourth semiconductor chip 307 are mounted on the second wiring layer 305, and these are molded with a second molding resin 308. The third semiconductor chip 306 and the fourth semiconductor chip 307 are electrically connected to each other through a wiring 305*a* formed in the second wiring layer 305.

In addition, the upper and lower semiconductor chips are connected to each other by through electrodes 309 and 310 penetrating the first molding resin 304 and the second wiring layer 305, and bonding wires 311 and 312. In this technique, as illustrated in FIG. 4, there is no substrate in the wiring layer, and a thickness of the entire semiconductor device is small.

Next, a method for manufacturing the semiconductor device will be described. First, with a known WLP manufacturing process (RDL first method), the semiconductor chips and the through electrodes 309 and 310 are mounted on a support substrate on which the first wiring layer 301 is formed, and a molding resin layer is formed. Next, the second wiring layer 305 is formed on the molding resin layer by using a semiconductor process device, and then the semiconductor chips are mounted on the second wiring layer 305, and are caused to have conduction to the through electrodes 309 and 310 by using the bonding wires 311 and 312. Next, the semiconductor chips on the second wiring layer 305 are molded with a molding resin. Finally, the support substrate is peeled off, and terminals are attached to the first wiring layer 301 exposed. This manufacturing method is batch mounting on a wafer scale, and is superior in manufacturing cost to manufacturing for each package.

CITATION LIST

Non Patent Literature

Non Patent Literature 1: S. W. Ho et al., "Development of FO-WLP Package-on-Package using RDL-first Integration Flow", 2018 IEEE 20th Electronics Packaging Technology Conference, DOI:10.1109/EPTC.2018.8654431, pp. 621-617, 2018.

SUMMARY OF INVENTION

Technical Problem

However, in the above-described technique, warpage of a wafer is a problem. In general, in the WLP manufacturing process, wafer warpage due to a difference in thermal expansion coefficient between members occurs in mold sealing. A warped wafer causes a vacuum suction error when the wafer is fixed in the semiconductor process device, which makes wiring formation difficult. In addition, in Non Patent Literature 1, a two-layer structure of a semiconductor package is introduced, but in a case where semiconductor packages are further stacked in three or more layers, the problem of the warpage of the wafer described above becomes more remarkable.

In addition, manufacturing cost is also a problem. Since the second wiring layer is produced right over the first wiring layer, when a defect occurs in the formation of the second wiring layer, the semiconductor packages become defective including the semiconductor package of the first layer wiring. For this reason, a loss when a defect occurs is large, leading to an increase in manufacturing cost. In addition, in the above-described technique, a molding step is required for each layer on which the semiconductor package is mounted. The molding step takes time depending on curing of a resin to be used, and requires several hours in the case of a typical epoxy resin material. Such a process requiring a long time is performed a plurality of times, which leads to an increase in manufacturing man-hours.

The present invention has been made to solve the above problems, and an object thereof is to reduce manufacturing cost of a semiconductor device.

Solution to Problem

A semiconductor device according to the present invention includes: a first wiring layer in which a first wiring is formed; a first semiconductor chip mounted on the first wiring layer; a second wiring layer that is disposed on the first wiring layer and in which a second wiring is formed; a second semiconductor chip mounted on the second wiring layer; a through-hole formed in the second wiring layer; a molding resin layer that molds the first semiconductor chip on the first wiring layer and a molding resin layer that molds the second semiconductor chip on the second wiring layer, the molding layers being integrally formed through the through-hole; and a through electrode that is formed to penetrate the molding resin layer that molds the first semiconductor chip and connects the first wiring and the second wiring to each other.

In addition, a method for manufacturing a semiconductor device according to the present invention includes: a first step of forming, on a first support substrate, a first wiring layer in which a first wiring is formed; a second step of forming, on the first wiring layer, an auxiliary substrate including an opening in a formation region of the first wiring; a third step of mounting a first semiconductor chip on the first wiring layer in the opening of the auxiliary substrate; a fourth step of forming, on a second support substrate, a second wiring layer in which a second wiring is formed and a through-hole that penetrates the second support substrate is formed outside a formation region of the second wiring; a fifth step of mounting a second semiconductor chip on the second wiring layer; a sixth step of removing the second support substrate from the second wiring layer on which the second semiconductor chip is mounted; a seventh step of disposing, on the auxiliary substrate, the second wiring layer from which the second support substrate is removed; an eighth step of integrally forming a molding resin layer that molds the first semiconductor chip on the first wiring layer and a molding resin layer that molds the second semiconductor chip on the second wiring layer through the through-hole; and a ninth step of forming a through electrode that penetrates the molding resin layer that molds the first semiconductor chip and connects the first wiring and the second wiring to each other.

In addition, a method for manufacturing a semiconductor device according to the present invention includes: a first step of forming, on a first support substrate, a first wiring layer in which a first wiring is formed; a second step of mounting a first semiconductor chip on the first wiring layer; a third step of forming a first insulating layer that covers the first semiconductor chip on the first wiring layer; a fourth step of forming, on a second support substrate, a second wiring layer in which a second wiring is formed; a fifth step of mounting a second semiconductor chip on the second wiring layer; a sixth step of forming a second insulating layer that covers the second semiconductor chip on the second wiring layer; a seventh step of removing the second support substrate from the second wiring layer on which the second semiconductor chip covered with the second insulating layer is mounted; an eighth step of disposing, on the first insulating layer, the second wiring layer from which the second support substrate is removed; and a ninth step of forming a through electrode that penetrates the first insulating layer and connects the first wiring and the second wiring to each other.

Advantageous Effects of Invention

As described above, according to the present invention, since the molding resin layers in the stacked wiring layers are integrally formed, the manufacturing cost of the semiconductor device can be reduced.

DESCRIPTION OF EMBODIMENTS

Hereinafter, a description will be given of a semiconductor device and a method for manufacturing the same according to an embodiment of the present invention.

First Embodiment

Figure 1:
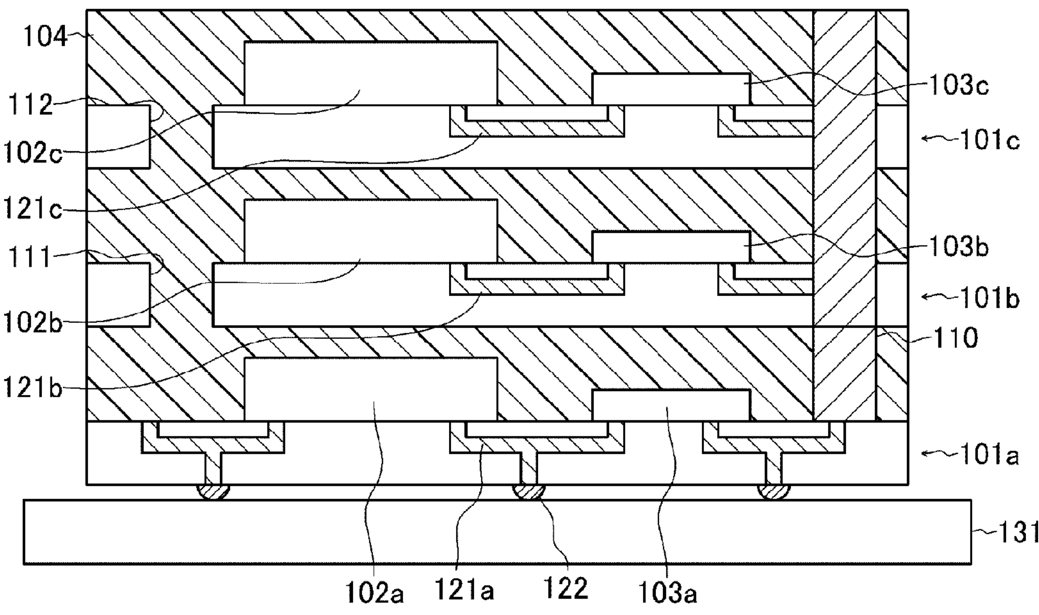
FIG. 1 is a cross-sectional view illustrating a configuration of a semiconductor device according to a first embodiment of the present invention.

First, a semiconductor device according to a first embodiment of the present invention will be described with reference to FIG. 1. The semiconductor device includes a first wiring layer 101*a*, a first semiconductor chip 102*a*, a second wiring layer 101*b*, and a second semiconductor chip 102*b*.

In the first wiring layer 101*a*, a first wiring 121*a* is formed. In addition, on the first wiring layer 101*a*, the first semiconductor chip 102*a* is mounted. In the second wiring layer 101*b*, a second wiring 121*b* is formed. In addition, the second wiring layer 101*b* is formed on the first wiring layer 101*a*. In addition, on the second wiring layer 101*b*, the second semiconductor chip 102*b* is mounted. In addition, in the second wiring layer 101*b*, a through-hole 111 is formed.

In addition, in the semiconductor device, a molding resin layer 104 that molds the first semiconductor chip 102*a* on the first wiring layer 101*a* and a molding resin layer 104 that molds the second semiconductor chip 102*b* on the second wiring layer 101*b* are formed, and the molding resin layers 104 are integrally formed through the through-hole 111.

The first wiring layer 101*a*, the first semiconductor chip 102*a*, and the molding resin layer 104 that molds the first semiconductor chip 102*a* can be made as one semiconductor package. Similarly, the second wiring layer 101*b*, the second semiconductor chip 102*b*, and the molding resin layer 104 that molds the second semiconductor chip 102*b* can be made as one semiconductor package.

In addition, the semiconductor device includes a through electrode 110 that is formed to penetrate the molding resin layer 104 that molds the first semiconductor chip 102*a* and connects the first wiring 121*a* and the second wiring 121*b* to each other.

In the first embodiment, a third wiring layer 101*c* is further included. In the third wiring layer 101*c*, a third wiring 121*c* is formed. In addition, the third wiring layer 101*c* is formed on the second wiring layer 101*b*. In addition, on the third wiring layer 101*c*, a third semiconductor chip 102*c* is mounted. In addition, in the third wiring layer 101*c*, a through-hole 112 is formed.

In addition, in the first embodiment, a molding resin layer 104 that molds the third semiconductor chip 102*c* is also formed on the third wiring layer 101*c*, and the molding resin layers 104 are integrally formed through the through-hole 111 and the through-hole 112. The third wiring layer 101*c*, the third semiconductor chip 102*c*, and the molding resin layer 104 that molds the third semiconductor chip 102*c* can be made as one semiconductor package. In this example, three semiconductor packages are stacked.

In addition, in the first embodiment, on the first wiring layer 101*a*, a fourth semiconductor chip 103*a* is mounted, and on the second wiring layer 101*b*, a fifth semiconductor chip 103*b* is mounted, and on the third wiring layer 101*c*, a sixth semiconductor chip 103*c* is mounted. In addition, the fourth semiconductor chip 103*a* is molded in the molding resin layer 104 on the first wiring layer 101*a*. The fifth semiconductor chip 103*b* is molded in the molding resin layer 104 on the second wiring layer 101*b*. The sixth semiconductor chip 103*c* is molded in the molding resin layer 104 on the third wiring layer 101*c*. In addition, the through electrode 110 is formed to also penetrate the molding resin layer 104 that molds the second semiconductor chip 102*b*, and connects the first wiring 121*a*, the second wiring 121*b*, and the third wiring 121*c* to each other.

In addition, the semiconductor device includes a terminal 122 connected to the first wiring 121*a* under (lower surface) the first wiring layer 101*a*, and is electrically connected (mounted) to a printed circuit board 131 through the terminal 122. In this example, secondary mounting on the printed circuit board 131 is exemplified, but an effect of the present invention can be obtained even for a design in which the secondary mounting is not performed.

According to the first embodiment described above, for a plurality of stacked wiring layers, the molding resin layers are integrally formed, so that it is not necessary to form the resin layer a plurality of times, and the manufacturing cost of the semiconductor device can be reduced. In addition, in the first embodiment, since there is no substrate in the semiconductor package, it is possible to achieve a semiconductor device having a package-on-package structure in which an overall thickness is reduced. Note that the first semiconductor chip 102*a* and the second semiconductor chip 102*b* can include the same material, or can respectively include materials different from each other. In addition, the semiconductor chips can have the same thickness (height), or can respectively have thicknesses different from each other.

Next, a method for manufacturing a semiconductor device according to the first embodiment of the present invention will be described with reference to FIGS. 2A to 2K.

Figure 2A:
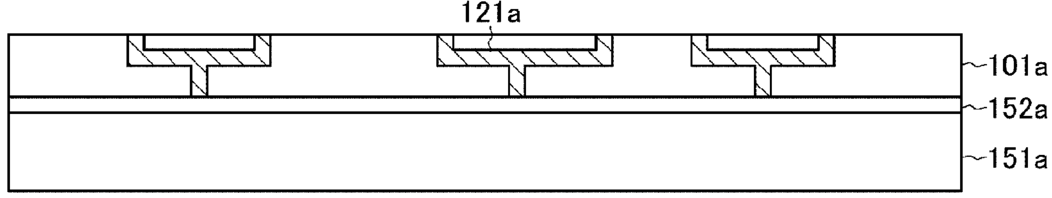
FIG. 2A is a cross-sectional view illustrating a state of a semiconductor device in an intermediate step for explaining a method for manufacturing a semiconductor device according to the first embodiment of the present invention.
Figure 2B:
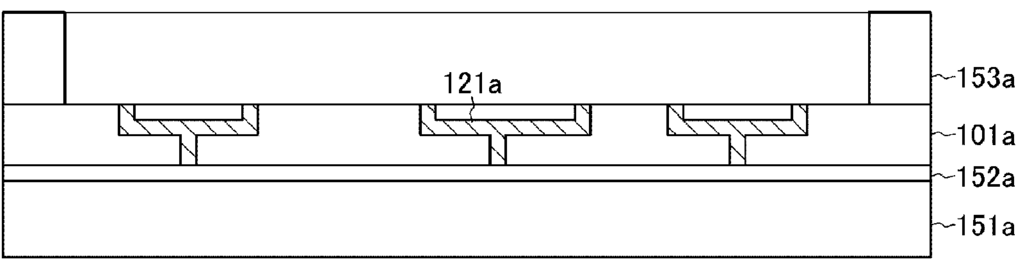
FIG. 2B is a cross-sectional view illustrating a state of the semiconductor device in an intermediate step for explaining the method for manufacturing the semiconductor device according to the first embodiment of the present invention.
Figure 2C:
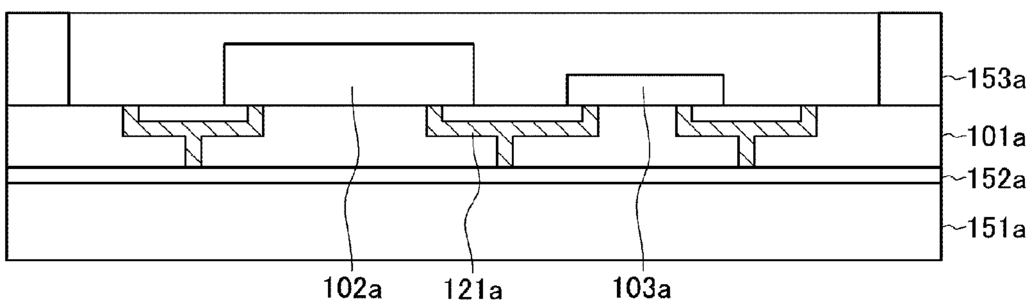
FIG. 2C is a cross-sectional view illustrating a state of the semiconductor device in an intermediate step for explaining the method for manufacturing the semiconductor device according to the first embodiment of the present invention.

First, as illustrated in FIG. 2A, the first wiring layer 101*a* in which the first wiring 121*a* is formed is formed on a first support substrate 151*a* (first step). For example, the first wiring layer 101*a* is formed on the first support substrate 151*a* with an adhesive layer 152*a* interposed therebetween. For example, the first wiring layer 101*a* can be formed by a known build-up method. The first support substrate 151*a* is, for example, a so-called wafer having a circular shape in plan view, and a plurality of regions to be made as packages are formed. FIGS. 2A to 2C illustrate a portion of the regions. The first support substrate 151*a* can include, for example, a semiconductor such as silicon, glass, resin, metal, or the like.

Next, as illustrated in FIG. 2B, a first auxiliary substrate 153*a* having an opening in a formation region of the first wiring 121*a* is formed on the first wiring layer 101*a* (second step). The first auxiliary substrate 153*a* is, for example, a so-called wafer having a circular shape in plan view, and includes a plurality of openings formed corresponding to regions to be made as packages. For example, the first auxiliary substrate 153*a* can be formed on the first wiring layer 101*a* by pasting the first auxiliary substrate 153*a* by using silver paste.

Next, as illustrated in FIG. 2C, the first semiconductor chip 102*a* and the fourth semiconductor chip 103*a* are mounted on the first wiring layer 101*a* in the opening of the first auxiliary substrate 153*a* (third step). On each semiconductor chip, a solder bump is mounted, and each semiconductor chip is mounted on the first wiring layer 101*a* by a chip mounter or the like, and then connected to the first wiring 121*a* by batch reflow. In addition, the first semiconductor chip 102a and the fourth semiconductor chip 103a are thinner than the first auxiliary substrate 153a.

Figure 2D:
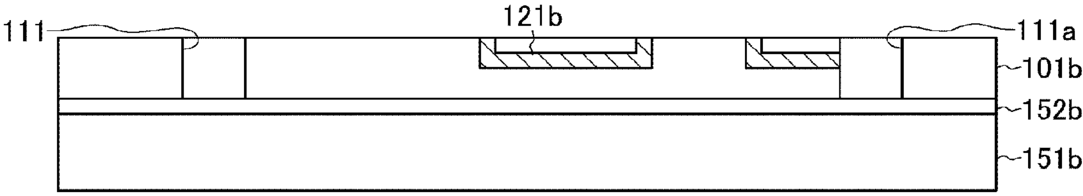
FIG. 2D is a cross-sectional view illustrating a state of the semiconductor device in an intermediate step for explaining the method for manufacturing the semiconductor device according to the first embodiment of the present invention.
Figure 2E:
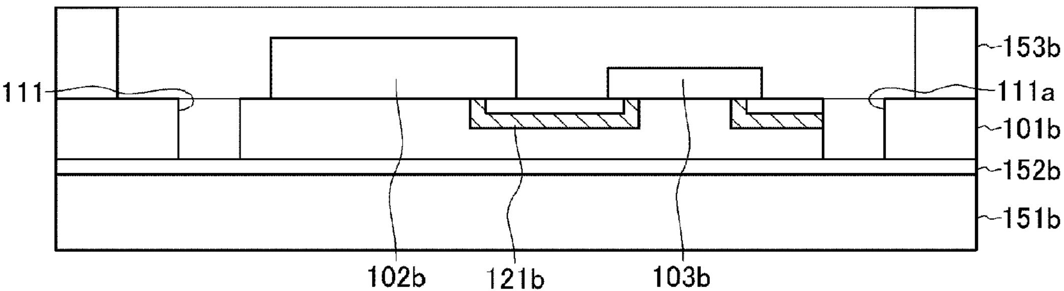
FIG. 2E is a cross-sectional view illustrating a state of the semiconductor device in an intermediate step for explaining the method for manufacturing the semiconductor device according to the first embodiment of the present invention.
Figure 2F:
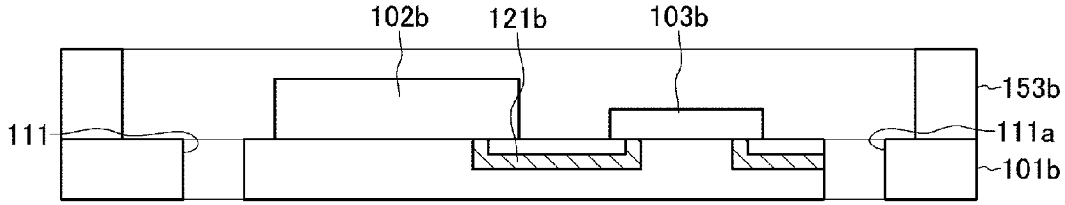
FIG. 2F is a cross-sectional view illustrating a state of the semiconductor device in an intermediate step for explaining the method for manufacturing the semiconductor device according to the first embodiment of the present invention.

Next, as illustrated in FIG. 2D, on a second support substrate 151b, the second wiring layer 101b is formed in which the second wiring 121b is formed and the through-hole 111 and a through-hole 111a that penetrate the second support substrate 151b are formed outside a formation region of the second wiring 121b (fourth step). The second wiring layer 101b is formed on the second support substrate 151b with an adhesive layer 152b interposed therebetween. The second support substrate 151b is, for example, a so-called wafer having a circular shape in plan view, and a plurality of regions to be made as packages are formed. FIGS. 2D to 2F illustrate a portion of the regions. The second support substrate 151b can include, for example, a semiconductor such as silicon, glass, resin, metal, or the like.

In addition, in this example, as illustrated in FIG. 2E, a second auxiliary substrate 153b having an opening in a formation region of the second wiring 121b is formed on the second wiring layer 101b. The second auxiliary substrate 153b is, for example, a so-called wafer having a circular shape in plan view, and includes a plurality of openings formed corresponding to regions to be made as packages. For example, the second auxiliary substrate 153b can be formed on the second wiring layer 101b by pasting the second auxiliary substrate 153b by using silver paste.

Next, as illustrated in FIG. 2E, the second semiconductor chip 102b and the fifth semiconductor chip 103b are mounted on the second wiring layer 101b (fifth step). Next, the second support substrate 151b is removed from the second wiring layer 101b on which the second semiconductor chip 102b is mounted, and a back surface of the second wiring layer 101b is exposed as illustrated in FIG. 2F (sixth step). The second support substrate 151b is removed by peeling (removing) the adhesive layer 152b. For example, the second support substrate 151b can be removed (separated) by a separation technique such as laser peeling, thermal peeling, mechanical peeling, or solvent peeling.

Figure 2G:
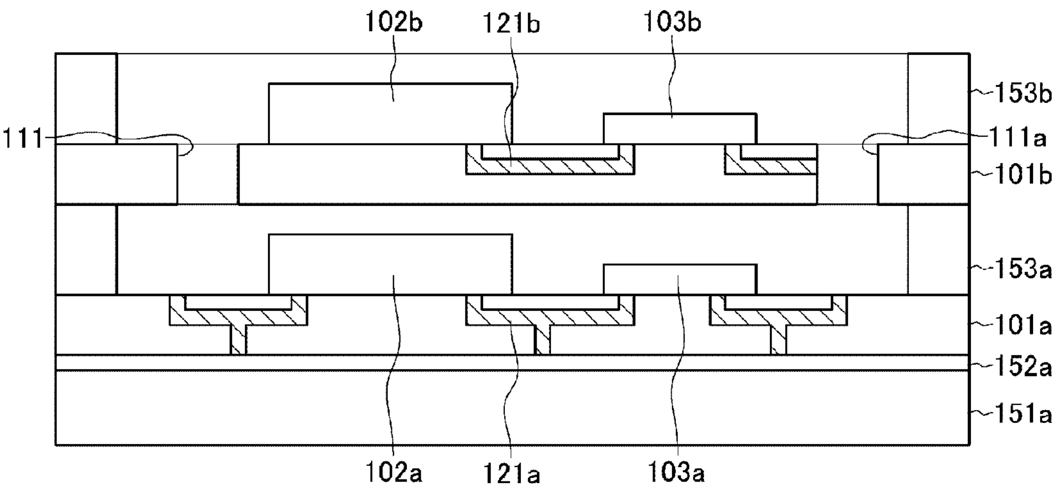
FIG. 2G is a cross-sectional view illustrating a state of the semiconductor device in an intermediate step for explaining the method for manufacturing the semiconductor device according to the first embodiment of the present invention.

Next, as illustrated in FIG. 2G, the second wiring layer 101b from which the second support substrate 151b is removed is disposed (mounted) on the first auxiliary substrate 153a (seventh step). For example, the second wiring layer 101b can be mounted on the first auxiliary substrate 153a by using Ag paste.

Next, similarly to the description using FIG. 2D, on a third support substrate (not illustrated), the third wiring layer 101c is formed in which the third wiring 121c is formed and the through-hole 112 and through-hole 112a that penetrate the third support substrate are formed outside a formation region of the third wiring 121c. The third wiring layer 101c is formed on the third support substrate with an adhesive layer interposed therebetween.

Next, similarly to the description using FIG. 2E, a third auxiliary substrate 153c having an opening in a formation region of the third wiring 121c is formed on the third wiring layer 101c. Next, similarly to the description using FIG. 2F, the third support substrate is removed from the third wiring layer 101c on which the third semiconductor chip 102c is mounted, and a back surface of the second wiring layer 101b is exposed.

Figure 2H:
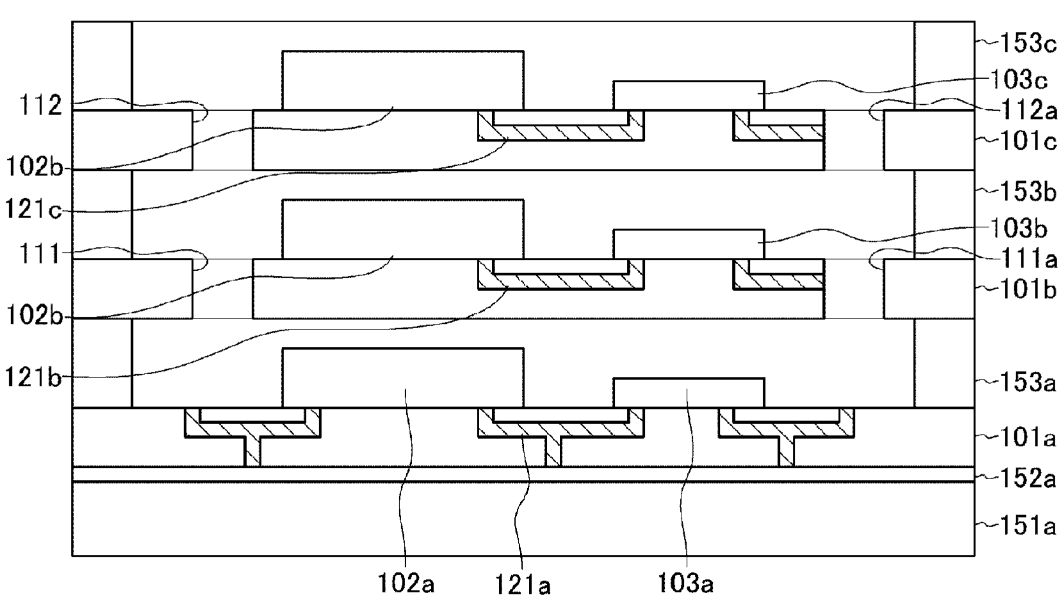
FIG. 2H is a cross-sectional view illustrating a state of the semiconductor device in an intermediate step for explaining the method for manufacturing the semiconductor device according to the first embodiment of the present invention.

Next, as illustrated in FIG. 2H, the third wiring layer 101c from which the third support substrate is removed is mounted on the second auxiliary substrate 153b. The third wiring layer 101c can be mounted on the second auxiliary substrate 153b by using Ag paste.

Figure 2I:
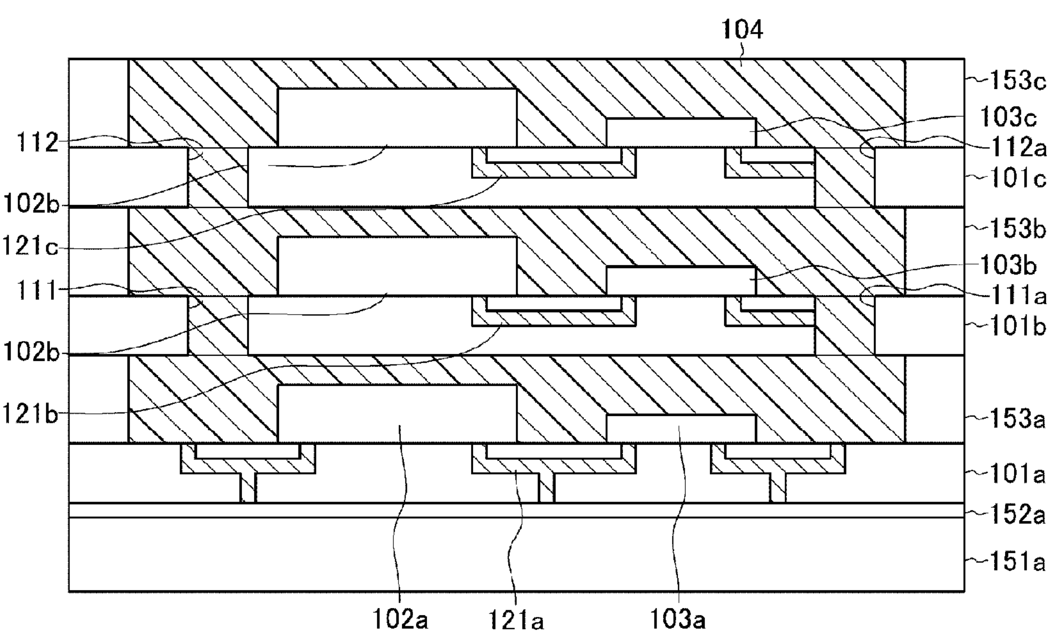
FIG. 2I is a cross-sectional view illustrating a state of the semiconductor device in an intermediate step for explaining the method for manufacturing the semiconductor device according to the first embodiment of the present invention.

Next, as illustrated in FIG. 2I, the molding resin layer 104 that molds the first semiconductor chip 102a and the fourth semiconductor chip 103a on the first wiring layer 101a, and the molding resin layer 104 that molds the second semiconductor chip 102b and the fifth semiconductor chip 103b on the second wiring layer 101b are integrally formed through the through-hole 111 and the through-hole 111a (eighth step). In this example, the molding resin layer 104 that molds the third semiconductor chip 102c and the sixth semiconductor chip 103c on the third wiring layer 101c is also integrally formed through the through-hole 112 and the through-hole 112a. Molding resin can form the molding resin layer 104 by molding with the molding resin by, for example, a known trans-molding method, and curing the molding resin.

Figure 2J:
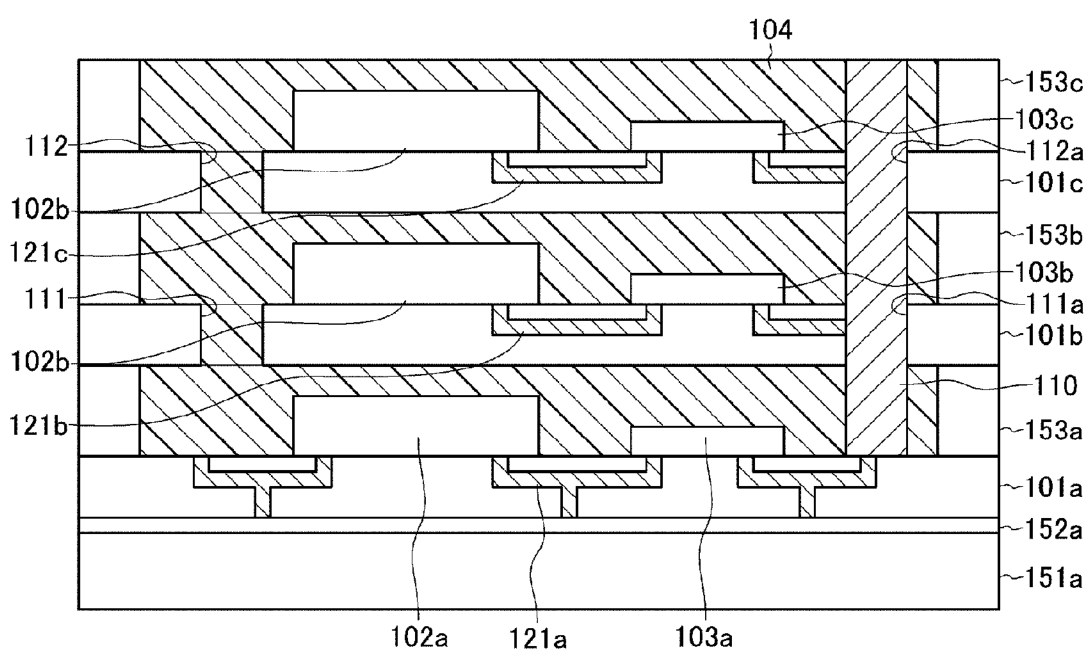
FIG. 2J is a cross-sectional view illustrating a state of the semiconductor device in an intermediate step for explaining the method for manufacturing the semiconductor device according to the first embodiment of the present invention.

Next, as illustrated in FIG. 2J, the through electrode 110 is formed that penetrates the molding resin layer 104 that molds the first semiconductor chip 102a and the molding resin layer 104 that molds the second semiconductor chip 102b and connects the first wiring 121a, the second wiring 121b, and the third wiring 121c to each other (ninth step). For example, a hole is formed at a predetermined position of the molding resin layer 104 by a laser or the like, and then the formed hole is filled with a metal such as copper by a plating method or the like, whereby the through electrode 110 can be formed.

Figure 2K:
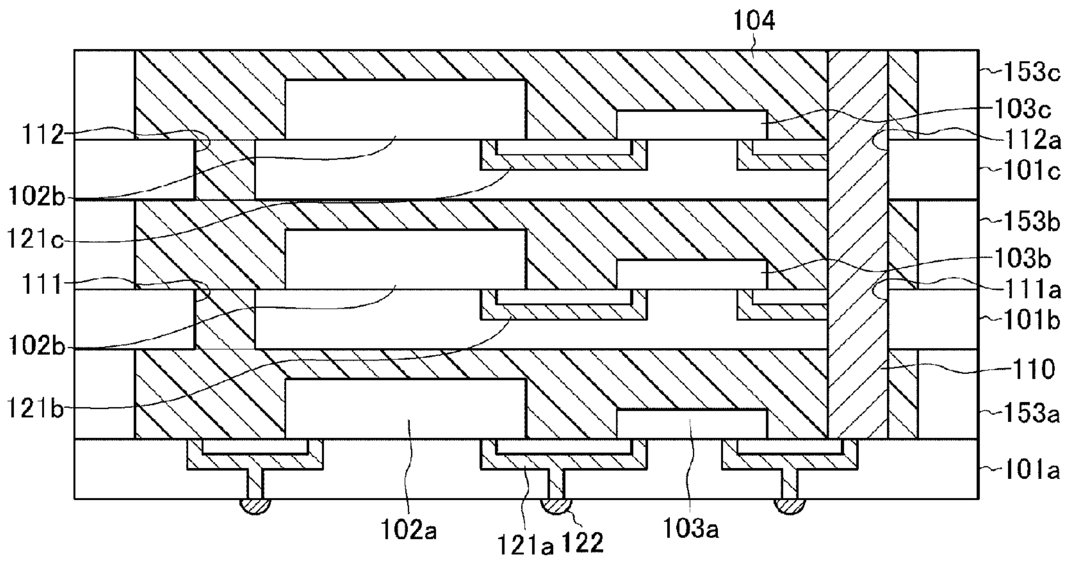
FIG. 2K is a cross-sectional view illustrating a state of the semiconductor device in an intermediate step for explaining the method for manufacturing the semiconductor device according to the first embodiment of the present invention.

Next, the first support substrate 151a is removed from the first wiring layer 101a, and a back surface of the first wiring layer 101a is exposed as illustrated in FIG. 2K. The first support substrate 151a is removed by peeling (removing) the adhesive layer 152a. For example, the first support substrate 151a can be removed (separated) by a separation technique such as laser peeling, thermal peeling, mechanical peeling, or solvent peeling. In addition, the terminal 122 connected to the first wiring 121a is formed on the back surface (lower surface) of the first wiring layer 101a exposed. The terminal 122 can be, for example, a solder bump.

Next, package regions are cut out and divided into pieces by a dicing device. In this cutting, portions of the auxiliary substrates are simultaneously cut and removed, and a chip size in plan view is reduced. Thereafter, mounting is performed on a printed circuit board through a terminal of each of the packages divided into pieces, whereby the semiconductor device illustrated in FIG. 1 can be made. For example, in a case where a solder bump is used, the mounting can be performed by a known reflow technique.

According to the method for manufacturing the semiconductor device according to the first embodiment described above, since the auxiliary substrate increases mechanical strength of the wiring layer, even in a case where the wiring layer is thin, destruction due to insufficient mechanical strength during a manufacturing step does not occur. In addition, since mechanical strength of the semiconductor device is increased by the molding resin after the molding resin layer is formed, even if the first support substrate is separated from the semiconductor device or the auxiliary substrate is removed by dicing, destruction due to insufficient mechanical strength does not occur.

In addition, since the mold resin layer is formed after the wiring layers are stacked, wiring formation is possible without considering wafer warpage due to formation of the molding resin layer. For a similar reason, it is possible to improve a yield of the semiconductor package in which the plurality of wiring layers is stacked.

In addition, since each wiring layer is individually produced, it is possible to select and stack wiring layers having no defect, and thus, it is possible to suppress a loss due to a defect of the wiring layer after a stacked body is made. In this respect, the manufacturing cost can be suppressed. In addition, regardless of the number of layers of the semiconductor package, the molding steps can be completed once, and a process time can be shortened. For these reasons, manufacturing man-hours can be reduced.

Second Embodiment

Next, a method for manufacturing a semiconductor device according to a second embodiment of the present invention will be described with reference to FIGS. 3A to 3E.

Figure 3A:
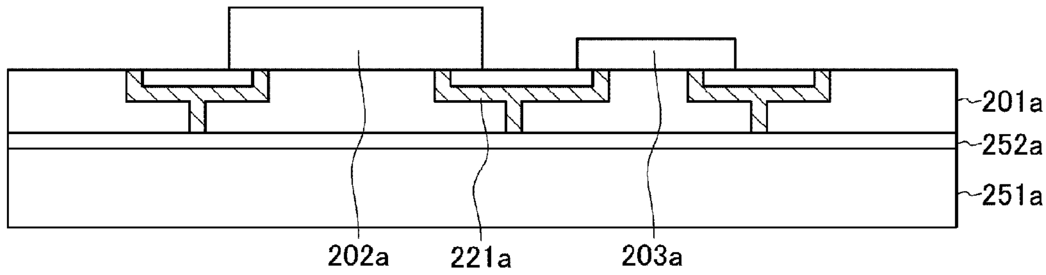
FIG. 3A is a cross-sectional view illustrating a state of a semiconductor device in an intermediate step for explaining a method for manufacturing a semiconductor device according to a second embodiment of the present invention.

First, as illustrated in FIG. 3A, a first wiring layer 201*a* in which a first wiring 221*a* is formed is formed on a first support substrate 251*a* (first step). For example, the first wiring layer 201*a* can be formed by a known build-up method. The first support substrate 251*a* is, for example, a so-called wafer having a circular shape in plan view, and a plurality of regions to be made as packages are formed. FIGS. 3A to 3D illustrate a portion of the regions. The first support substrate 251*a* can include, for example, a semiconductor such as silicon, glass, resin, metal, or the like.

In addition, a first semiconductor chip 202*a* and a fourth semiconductor chip 203*a* are mounted on the first wiring layer 201*a* (second step). A solder bump is mounted on each semiconductor chip, and mounting is performed on the first wiring layer 201*a* by a chip mounter or the like, and then connection to the first wiring 221*a* is made by batch reflow.

Figure 3B:
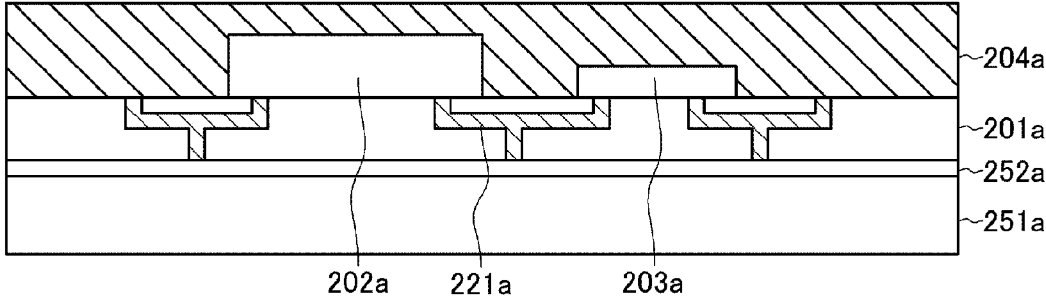
FIG. 3B is a cross-sectional view illustrating a state of the semiconductor device in an intermediate step for explaining the method for manufacturing the semiconductor device according to the second embodiment of the present invention.

Next, as illustrated in FIG. 3B, a first insulating layer 204*a* that covers the first semiconductor chip 202*a* and the fourth semiconductor chip 203*a* is formed on the first wiring layer 201*a* (third step). The first semiconductor chip 202*a* and the fourth semiconductor chip 203*a* are sealed with the first insulating layer 204*a*. For example, the first insulating layer 204*a* can be formed by applying and curing a low dielectric constant resin such as benzocyclobutene (BCB).

Next, a second wiring layer 201*b* on which a second wiring 221*b* is formed is formed on a second support substrate (not illustrated) (fourth step), and a second semiconductor chip 202*b* and a fifth semiconductor chip 203*b* are mounted on the second wiring layer 201*b* (fifth step). For example, the second wiring layer 201*b* can be formed on the second support substrate with an adhesive layer (not illustrated) interposed therebetween. The second support substrate is, for example, a so-called wafer having a circular shape in plan view, and a plurality of regions to be made as packages are formed. The second support substrate can include, for example, a semiconductor such as silicon, glass, resin, metal, or the like.

Next, a second insulating layer 204*b* that covers the second semiconductor chip 202*b* is formed on the second wiring layer 201*b* (sixth step). The second semiconductor chip 202*b* and the fifth semiconductor chip 203*b* are sealed with the second insulating layer 204*b*. For example, the second insulating layer 204*b* can be formed by applying and curing a low dielectric constant resin such as BCB.

Figure 3C:
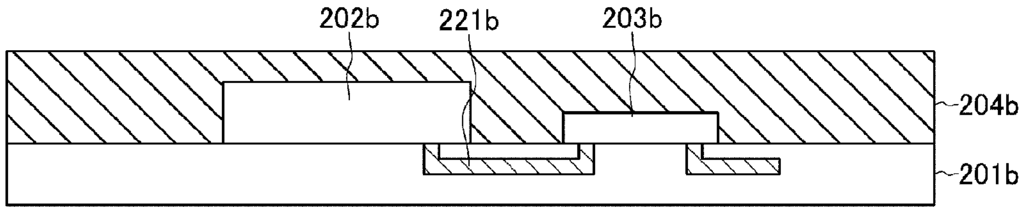
FIG. 3C is a cross-sectional view illustrating a state of the semiconductor device in an intermediate step for explaining the method for manufacturing the semiconductor device according to the second embodiment of the present invention.

Thereafter, the second support substrate is removed from the second wiring layer 201*b* on which the second semiconductor chip 202*b* and the fifth semiconductor chip 203*b* covered with the second insulating layer 204*b* are mounted, and a back surface of the second wiring layer 201*b* is exposed as illustrated in FIG. 3C (seventh step). The second support substrate can be removed by peeling (removing) the adhesive layer. For example, the second support substrate can be removed (separated) by a separation technique such as laser peeling, thermal peeling, mechanical peeling, or solvent peeling. Here, the second insulating layer 204*b* is formed sufficiently thick so that sufficient mechanical strength can be obtained alone even if the second support substrate is removed.

Figure 3D:
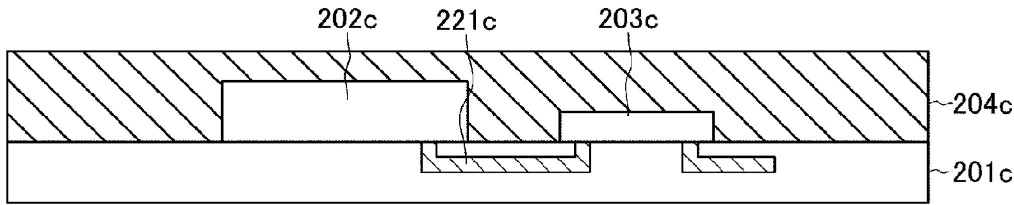
FIG. 3D is a cross-sectional view illustrating a state of the semiconductor device in an intermediate step for explaining the method for manufacturing the semiconductor device according to the second embodiment of the present invention.

Next, similarly to the above, as illustrated in FIG. 3D, a third semiconductor chip 202*c* and a sixth semiconductor chip 203*c* to be connected to a third wiring 221*c* are mounted, and a third wiring layer 201*c* is obtained on which theses are sealed with a third insulating layer 204*c*.

Figure 3E:
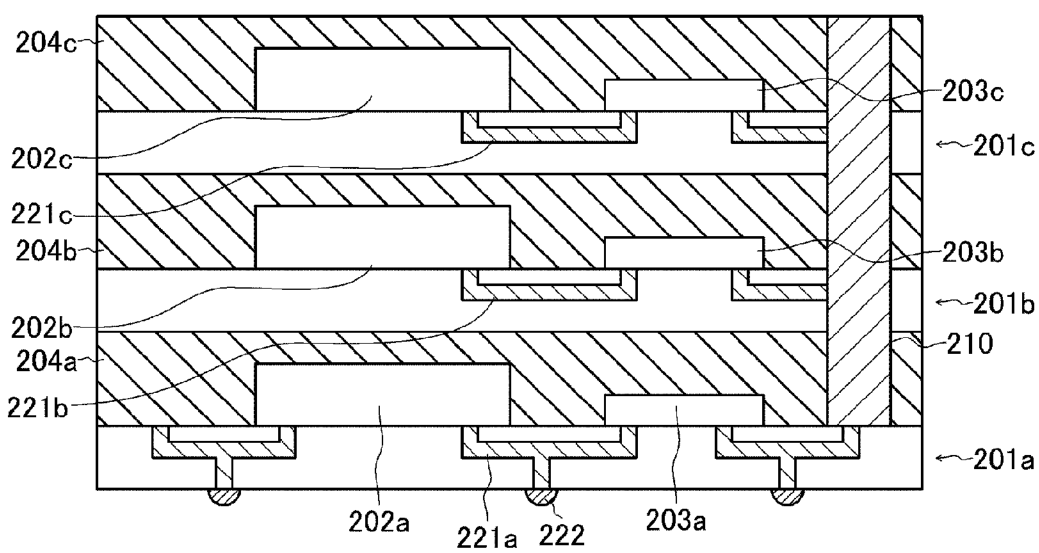
FIG. 3E is a cross-sectional view illustrating a state of the semiconductor device in an intermediate step for explaining the method for manufacturing the semiconductor device according to the second embodiment of the present invention.
Figure 4:
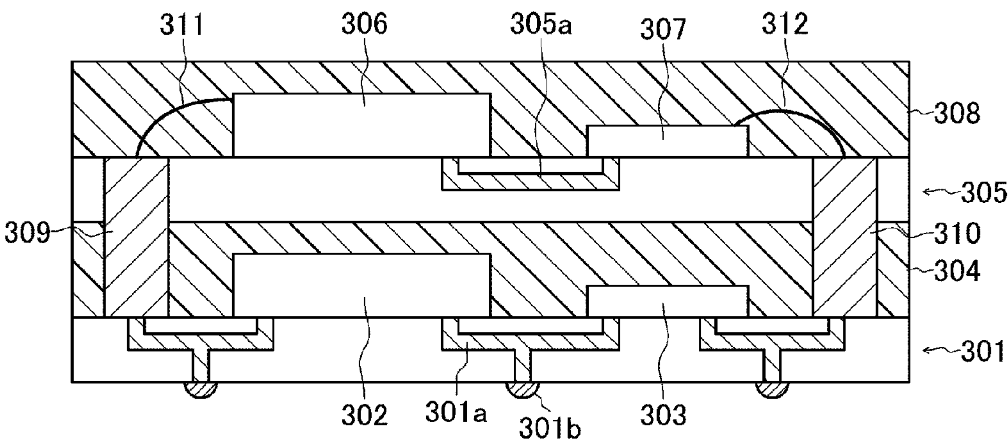
FIG. 4 is a cross-sectional view illustrating a configuration of a conventional semiconductor device.

Next, as illustrated in FIG. 3E, the second wiring layer 201*b* from which the second support substrate is removed is disposed and fixed on the first insulating layer 204*a* (eighth step). For example, an epoxy resin is applied onto the first insulating layer 204*a* by using a coating device such as a spin coater to form an adhesive layer. Next, the second wiring layer 201*b* is mounted on the adhesive layer, and the adhesive layer is thermally cured. As a result, the second wiring layer 201*b* can be fixed on the first insulating layer 204*a*. Similarly, the third wiring layer 201*c* is disposed and fixed on the second insulating layer 204*b*.

Next, a through electrode 210 is formed that penetrates the first insulating layer 204*a* and the second insulating layer 204*b* (and the third insulating layer 204*c*) and connects the first wiring 221*a*, the second wiring 221*b*, and the third wiring 221*c* to each other (ninth step). For example, a hole is formed at a predetermined position by a laser or the like, and then the formed hole is filled with a metal such as copper by a plating method or the like, whereby the through electrode 210 can be formed.

Next, the first support substrate 251*a* is removed from the first wiring layer 201*a*, and a back surface of the first wiring layer 201*a* is exposed. The first support substrate 251*a* is removed by peeling (removing) an adhesive layer 252*a*. For example, the first support substrate 251*a* can be removed (separated) by a separation technique such as laser peeling, thermal peeling, mechanical peeling, or solvent peeling. In addition, a terminal 222 connected to the first wiring 221*a* is formed on the back surface (lower surface) of the first wiring layer 201*a* exposed. The terminal 222 can be, for example, a solder bump.

Next, package regions are cut out and divided into pieces by a dicing device. Thereafter, mounting is performed on a printed circuit board through a terminal of each of the packages divided into pieces. For example, in a case where a solder bump is used, the mounting can be performed by a known reflow technique.

According to the method for manufacturing the semiconductor device according to the second embodiment described above, since the mechanical strength of the wiring layer is increased by the insulating layer that covers (seals) the semiconductor chip, even in a case where the wiring layer is thin, destruction due to insufficient mechanical strength during a manufacturing step does not occur. In addition, since mechanical strength of the semiconductor device is increased by the insulating layer after the insulating layer is formed, even if the support substrate is separated from the semiconductor device or the auxiliary substrate is removed by dicing, destruction due to insufficient mechanical strength does not occur.

As described above, according to the present invention, since the molding resin layers in the stacked wiring layers are integrally formed, it becomes possible to reduce the manufacturing cost of the semiconductor device.

Note that the present invention is not limited to the embodiments described above, and it is obvious that many modifications and combinations can be made by those skilled in the art within the technical idea of the present invention.

REFERENCE SIGNS LIST

101*a* first wiring layer
101*b* second wiring layer
101*c* third wiring layer
102*a* first semiconductor chip
102*b* second semiconductor chip
102*c* third semiconductor chip
103*a* fourth semiconductor chip
103*b* fifth semiconductor chip
103*c* sixth semiconductor chip
104 molding resin layer
110 through electrode
111 through-hole
112 through-hole
121*a* first wiring
121*b* second wiring
121*c* third wiring
122 terminal
131 printed circuit board.

The invention claimed is:

1. A semiconductor device comprising:

a first wiring layer in which a first wiring is formed;

a first semiconductor chip mounted on the first wiring layer;

a second wiring layer that is disposed on the first wiring layer and in which a second wiring is formed;

a second semiconductor chip mounted on the second wiring layer;

a through-hole formed in the second wiring layer;

a molding resin layer including a first resin layer and a second resin layer, the first resin layer molding the first semiconductor chip on the first wiring layer, the second resin layer molding that molds the second semiconductor chip on the second wiring layer, and the first resin layer and the second resin layer being integrally formed through the through-hole; and a through electrode that penetrates both the first resin layer and the second resin layer and connects the first wiring and the second wiring to each other, a first end of the through electrode being connected to the first wiring, and a second end of the through electrode being exposed outside the molding resin layer.

2. The semiconductor device according to claim 1, wherein the first semiconductor chip and the second semiconductor chip respectively include materials different from each other.

3. A method for manufacturing a semiconductor device, comprising:

a first step of forming, on a first support substrate, a first wiring layer in which a first wiring is formed;

a second step of forming, on the first wiring layer, an auxiliary substrate including an opening in a formation region of the first wiring;

a third step of mounting a first semiconductor chip on the first wiring layer in the opening of the auxiliary substrate;

a fourth step of forming, on a second support substrate, a second wiring layer in which a second wiring is formed and a through-hole that penetrates the second support substrate is formed outside a formation region of the second wiring;

a fifth step of mounting a second semiconductor chip on the second wiring layer;

a sixth step of removing the second support substrate from the second wiring layer on which the second semiconductor chip is mounted;

a seventh step of disposing, on the auxiliary substrate, the second wiring layer from which the second support substrate is removed;

an eighth step of integrally forming a molding resin layer that molds the first semiconductor chip on the first wiring layer and a molding resin layer that molds the second semiconductor chip on the second wiring layer through the through-hole; and a ninth step of forming a through electrode that penetrates the molding resin layer that molds the first semiconductor chip and connects the first wiring and the second wiring to each other.

4. A method for manufacturing a semiconductor device, comprising:

a first step of forming, on a first support substrate, a first wiring layer in which a first wiring is formed;

a second step of mounting a first semiconductor chip on the first wiring layer;

a third step of forming a first insulating layer that covers the first semiconductor chip on the first wiring layer;

a fourth step of forming, on a second support substrate, a second wiring layer in which a second wiring is formed;

a fifth step of mounting a second semiconductor chip on the second wiring layer;

a sixth step of forming a second insulating layer that covers the second semiconductor chip on the second wiring layer;

a seventh step of removing the second support substrate from the second wiring layer on which the second semiconductor chip covered with the second insulating layer is mounted;

an eighth step of disposing, on the first insulating layer, the second wiring layer from which the second support substrate is removed; and a ninth step of forming a through electrode that penetrates the first insulating layer and connects the first wiring and the second wiring to each other.

5. The semiconductor device according to claim 1, wherein the first resin layer and the second resin layer are spaced apart and disposed on opposing sides of the second wiring layer.

6. The semiconductor device according to claim 1, wherein the through electrode passes through the second resin layer.

7. The semiconductor device according to claim 1, wherein the through electrode extends beyond opposing sides of the second wiring layer.

* * * * *